(12) United States Patent
Moon et al.

(10) Patent No.: US 7,392,408 B2
(45) Date of Patent: Jun. 24, 2008

(54) METHOD AND APPARATUS FOR SELECTIVELY PERFORMING LOCK-OUT FUNCTION IN INTEGRATED CIRCUIT DEVICE

(75) Inventors: Seung-Hyun Moon, Seoul (KR); Dae-Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 360 days.

(21) Appl. No.: 11/218,420

(22) Filed: Sep. 6, 2005

(65) Prior Publication Data

US 2006/0103480 A1    May 18, 2006

(30) Foreign Application Priority Data

Nov. 17, 2004   (KR)  ............... 10-2004-0094214

(51) Int. Cl.
*G06F 1/00* (2006.01)
*G06F 1/26* (2006.01)
(52) U.S. Cl. .................................. 713/300; 713/320
(58) Field of Classification Search ......... 713/300–340; 365/226–229; 702/57, 60–65
See application file for complete search history.

(56) References Cited

U.S. PATENT DOCUMENTS

| | | | | |
|---|---|---|---|---|
| 5,301,161 A | * | 4/1994 | Landgraf et al. | ....... 365/185.04 |
| 5,483,486 A | * | 1/1996 | Javanifard et al. | ...... 365/185.17 |
| 5,495,453 A | * | 2/1996 | Wojciechowski et al. | ............. 365/185.18 |
| 5,534,788 A | * | 7/1996 | Smith et al. | .................. 324/771 |
| 5,546,300 A | * | 8/1996 | Lee et al. | ..................... 363/132 |
| 5,594,360 A | * | 1/1997 | Wojciechowski | ........... 324/771 |
| 5,663,918 A | * | 9/1997 | Javanifard et al. | ........... 365/226 |
| 5,671,179 A | * | 9/1997 | Javanifard | .............. 365/185.33 |
| 5,675,485 A | * | 10/1997 | Seong | .......................... 363/97 |
| 5,739,680 A | * | 4/1998 | Lim et al. | .................... 323/313 |
| 5,757,635 A | * | 5/1998 | Seong | .......................... 363/89 |
| 5,818,707 A | * | 10/1998 | Seong et al. | ................... 363/89 |
| 5,896,338 A |  | 4/1999 | Landgraf et al. | |
| 6,031,755 A |  | 2/2000 | Ozawa | |
| 6,571,091 B1 | * | 5/2003 | Janssen et al. | ........... 455/343.1 |
| 6,629,047 B1 | * | 9/2003 | Guliani et al. | ................ 702/64 |
| 6,789,027 B2 |  | 9/2004 | Guliani et al. | |

FOREIGN PATENT DOCUMENTS

| | | |
|---|---|---|
| JP | 11-339500 | 12/1999 |
| KR | 1999-0031562 | 5/1999 |
| KR | 19990037479 | 10/1999 |
| KR | 1020030009597 A | 2/2003 |
| KR | 1020040056901 A | 7/2004 |
| WO | WO 98/47149 | 10/1998 |

* cited by examiner

*Primary Examiner*—Rehana Perveen
*Assistant Examiner*—Stefan Stoynov
(74) *Attorney, Agent, or Firm*—Volentine & Whitt, PLLC

(57) ABSTRACT

A lock-out circuit is adapted to selectively perform a lock-out function in an integrated circuit device. The lock-out function cuts off the supply of an operating voltage to the integrated circuit device whenever a power supply voltage for the device falls below a predetermined detection voltage. However, the lock-out function is disabled whenever the integrated circuit device performs an operation requiring a power supply voltage lower than the predetermined detection voltage.

19 Claims, 4 Drawing Sheets

METHOD AND APPARATUS FOR SELECTIVELY PERFORMING LOCK-OUT FUNCTION IN INTEGRATED CIRCUIT DEVICE

BACKGROUND OF THE INVENTION

1. Field of the Invention

The present invention relates generally to a semiconductor integrated circuit (IC) device. More particularly, the invention relates to a semiconductor IC device adapted to selectively perform a lock-out operation according to an operating mode of the integrated circuit device.

2. Description of the Related Art

Significant effort has been made to develop electronic devices with low operating voltages. Benefits of low-voltage electronic devices include, for example, decreased heat generation and decreased power consumption. These benefits are particularly important in portable electronic devices having limited power resources and in devices susceptible to heat damage.

A number of design issues arise when creating low-power electronic devices. One design issues relates to the way the low-voltage devices interact with other devices. For example, an issue arising due to the interaction of portable electronic devices with removable memory cards is described below.

Portable electronic devices often provide capabilities requiring relatively large amounts of memory. For instance, devices such as mobile phones and personal digital assistants (PDAs) often contain digital camera equipment producing large datasets in the form of still images and video and requiring a significant amount of memory for storage and processing.

One type of memory that is commonly used to store and process data in portable electronic devices is NAND flash memory. A common of providing NAND flash memory to a portable electronic device is in the form of a portable storage unit such as a removable memory card. A NAND flash memory chip is generally embedded in the removable memory card, and the flash memory chip becomes operatively connected with the device when the memory card is coupled to the device, e.g., by inserting the card into a card reader slot on the device. Examples of removable memory cards containing embedded NAND flash memory chips include multimedia cards (MMC), secure digital (SD) cards, smart media cards, and Compact Flash cards. Each of these types of memory cards is used to store and process various types of data including audio, video, etc. In addition, each of these types of memory cards is commonly used in devices such as digital cameras, MP3 players, PDAs, gaming devices, facsimile machines, scanners, and printers.

A removable memory card is typically designed to operate under a specific set of conditions. For example, a removable memory card may be designed to operate with a power supply voltage of 3.3V. However, where a memory card designed to operate with a power supply voltage of 3.3V is coupled to a portable electronic device using a lower power supply voltage, the memory card may not work properly.

In order to prevent problems from arising due to a low power supply voltage in a portable electronic device, a lock-out circuit may be included in a portable storage unit to disconnect the portable storage unit from the low power supply voltage. The lock-out circuit cuts off the supply of an operating voltage VCC (or an external power supply voltage EVC) in the portable storage unit whenever the operating voltage VCC falls below a predetermined reference voltage level. Once operating voltage VCC is cut off from the portable storage unit, the lock-out circuit executes a recovery operation to restore operating voltage VCC to above the reference voltage level. A lock-out circuit and a system including the same are disclosed, for example, in U.S. Pat. No. 6,434,653.

In addition to removable card systems, the lock-out circuit can also be included in flash memory devices fabricated as a single chip, or in other semiconductor devices including flash memories. The lock-out circuit can also be included in other semiconductor memory devices besides flash memory devices.

FIG. 1 is a waveform timing diagram illustrating the operation of a conventional lock-out circuit in a semiconductor memory device. Referring to FIG. 1, the lock-out circuit switches a lock-out control signal VLKO to a logic level "high" when operating voltage VCC (or an external power supply voltage EVC) falls below a predetermined detection voltage level Vdetect (indicated by an arrow (1)).

Once lock-out control signal VLKO is switched to logic level "high", operating voltage VCC is disconnected from the semiconductor memory device and a program or erase operation (PGM or ERS Execution) of the semiconductor memory device is terminated. Then, the lock-out circuit executes a recovery operation (PGM or ERS recovery) to restore operating voltage VCC to above detection voltage level Vdetect.

One problem with the method of operating the semiconductor memory device described above is that it disconnects operating voltage VCC from the semiconductor memory device in certain cases where the level of operating voltage VCC (or a low voltage of the external power supply voltage EVC) is sufficient to accomplish a specific function being performed by the semiconductor memory device. For example, where a function requiring a voltage level indicated by an arrow (2) is being performed by the semiconductor memory device, operating voltage VCC is disconnected and the function is terminated.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

SUMMARY OF THE INVENTION

Figure 1:
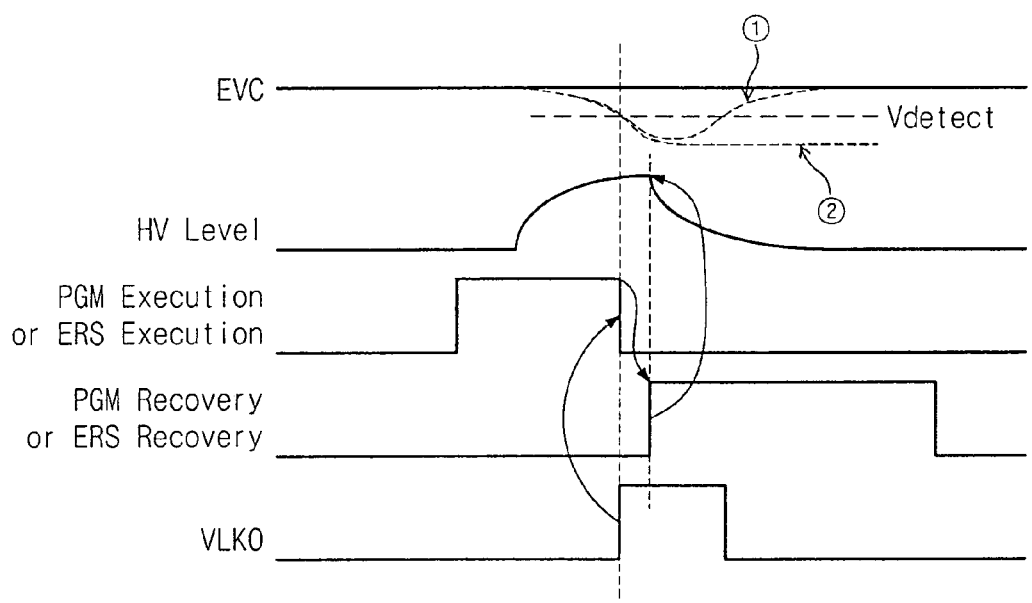
FIG. 1 is a waveform timing diagram illustrating the operation of a conventional lock-out circuit.

According to one embodiment of the invention, a lock-out circuit adapted for use in an integrated circuit device is provided. The lock-out circuit comprises a lock-out unit performing a lock-out function according to a level of a power supply voltage of the integrated circuit device. The lock-out circuit further comprises a lock-out controller adapted to selectively inactivate the lock-out function in response to a mode of the integrated circuit device.

Preferably, the lock-out controller disables the lock-out function whenever the integrated circuit device executes an operation requiring a voltage lower than a predetermined detection voltage. However, the lock-out function is preferably enabled whenever the integrated circuit device executes an operation requiring a voltage at least as high as the predetermined detection voltage.

The lock-out unit preferably comprises a mode detector sensing whether the integrated circuit device is in an active mode, a comparator detecting whether the power supply voltage is lower than a predetermined level while the integrated circuit device is in an active mode, and a signal combiner receiving an output of the mode detector and an output of the comparator and generating a lock-out control signal according to the logic levels of the respective outputs of the mode detector and the comparator.

The lock-out controller preferably comprises a logic circuit generating the lock-out disable signal according to the mode of the integrated circuit or a fuse circuit selectively switching on or off in response to control signals supplied by a user of the integrated circuit device.

According to another embodiment of the invention, a method of performing a lock-out function in an integrated circuit device is provided. The method comprises detecting an operating mode of the integrated circuit device, and selectively disabling a lock-out function of the integrated circuit device according to the operating mode of the integrated circuit device.

Preferably, the lock-out function is disabled whenever the integrated circuit executes an operating requiring a power supply voltage lower than a predetermined detection voltage. However, the lock-out function is preferably enabled whenever the integrated circuit is in an active mode and a power supply voltage falls below a predetermined detection voltage.

Selectively disabling the lock-out function preferably comprises determining whether the integrated circuit device is in an active mode, determining whether a power supply voltage of the integrated circuit device is lower than a predetermined detection voltage, determining whether the integrated circuit device is in a low-voltage operating mode, and upon determining that the integrated circuit device is in the low-voltage operating mode, disabling the lock-out function.

Preferably, determining whether the power supply voltage is lower than the predetermined detection voltage comprises dividing the power supply voltage by a predetermined amount and comparing a result of the division with a predetermined reference voltage.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

According to selected embodiments of the invention, a lock-out circuit and a related method of operation are provided. The lock-out circuit detects whether the operating voltage of an integrated circuit device falls below a predetermined detection voltage. Upon detecting that the operating voltage has fallen below the detection voltage, the lock-out circuit checks whether the integrated circuit device is performing an operating requiring a voltage at or above the predetermined detection voltage. Where the integrated circuit device is not performing an operation requiring an operating voltage at or above the predetermined detection voltage, the lock-out circuit allows the operating voltage of the integrated circuit device to remain connected to the device.

Otherwise, the lock-out circuit cuts off the operating voltage from the integrated circuit device to terminate the operation. The act of cutting off the operating voltage from the integrated circuit device, together with an operation designed to restore the operating voltage is called a "lock-out function". By selectively performing the lock-out function, operations requiring a low operating voltage are reliably executed, even in systems including a lock-out circuit.

An integrated circuit device typically receives an external power supply voltage EVC and generates an internal power supply voltage IVC. Internal power supply voltage IVC is generally derived from external power supply voltage EVC, e.g., by stepping down external power supply voltage EVC. Internal power supply voltage IVC typically serves as the operating voltage for performing various operations in the integrated circuit device.

Where external power supply voltage EVC falls below a predetermined detection voltage, it is difficult to obtain reliable operating characteristics for the integrated circuit device. For example, a programming operation of the integrated circuit device may fail where external power supply voltage EVC is too low.

The lock-out circuit performs a lock-out function in order to overcome problems associated with low levels of external power supply voltage EVC. However, in cases where a low level of external power supply voltage EVC is sufficient to accomplish a particular operation being performed by the integrated circuit device, the lock-out function is disabled.

Where the integrated circuit device is executing an operation requiring a voltage lower than the predetermined detection voltage, the integrated circuit device is said to be in a "low-power" operating mode. Otherwise, where the integrated circuit device is executing an operation requiring a voltage at least as high as the predetermined detection voltage, the integrated circuit device is said to be in an "active mode". The ability to disable the lock-out function according to the operating mode of the integrated circuit device minimizes the influence of a low external power supply voltage on the performance of the integrated circuit device.

The lock-out circuit may be used in any of a wide variety of integrated circuit devices, including semiconductor memory devices. For example, the lock-out circuit can be used within a flash memory device.

Figure 2:
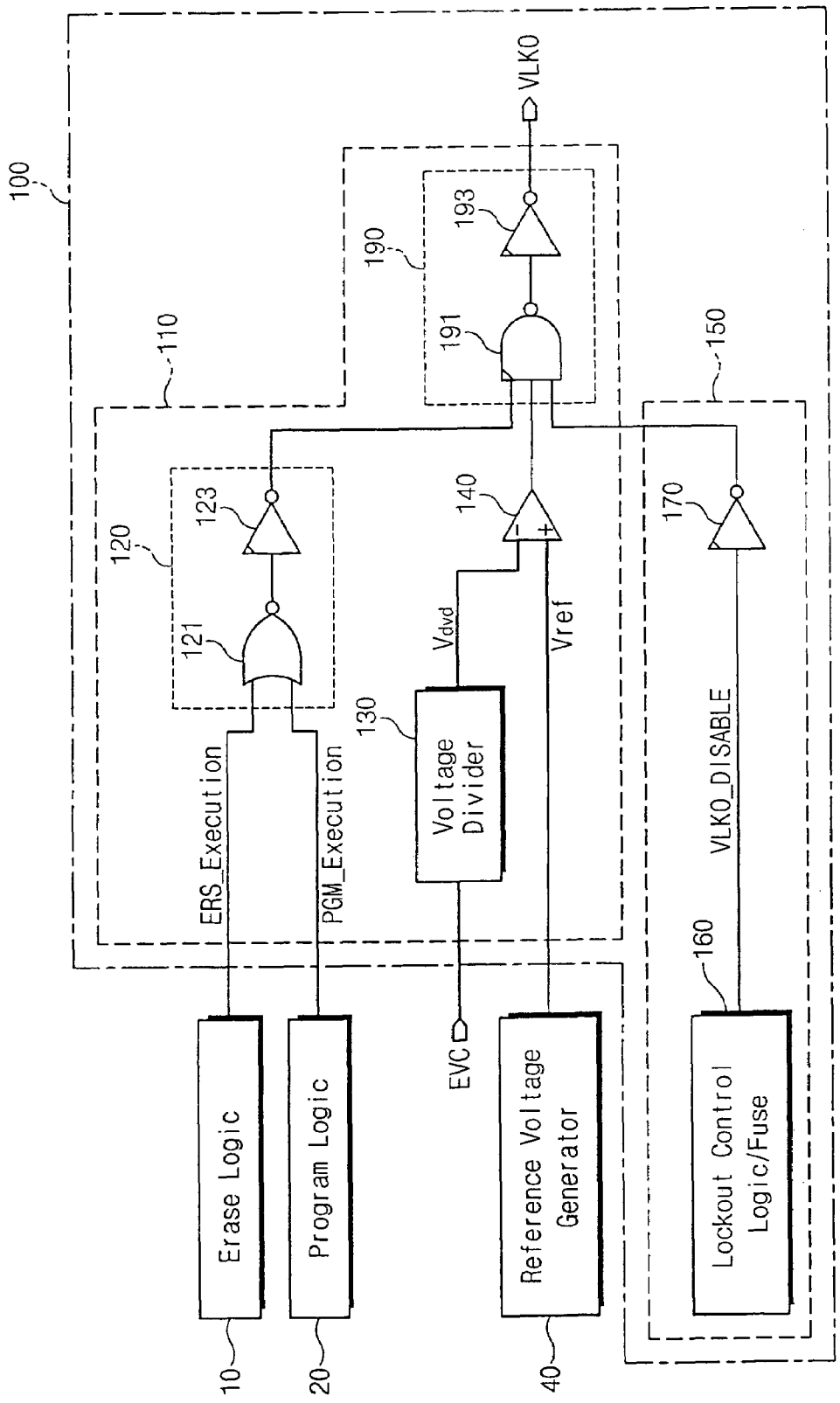
FIG. 2 is a block diagram illustrating a lock-out circuit according to one embodiment of the present invention.
Figure 3:
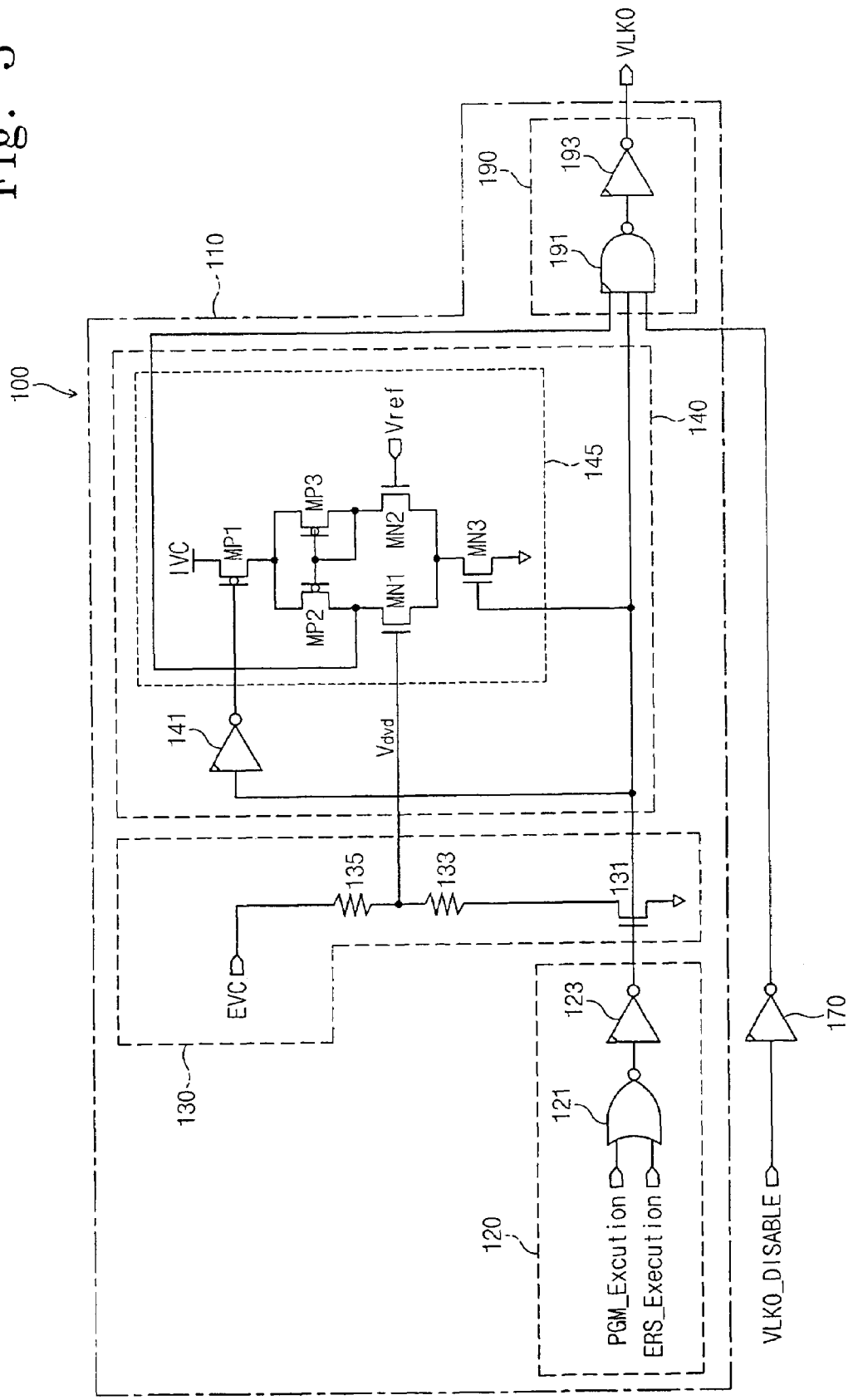
FIG. 3 is a circuit diagram of the lock-out circuit shown in FIG. 2.

FIG. 2 is a block diagram illustrating a lock-out circuit according to one embodiment of the present invention, and FIG. 3 is a circuit diagram of the lock-out circuit shown in FIG. 2.

Referring to FIGS. 2 and 3, a lock-out circuit 100 comprises a lock-out unit 110 and a lock-out controller 150. Lock-out unit 110 suspends an operation being performed by an integrated circuit device when an external power supply voltage EVC of the integrated circuit device falls below a predetermined detection voltage. Then, lock-out unit 110 performs a recovery operation to restore the voltage level of external power supply voltage EVC. The acts of suspending the operation being performed by the integrated circuit, together with the recovery operation constitute the "lock-out function".

Lock-out controller 150 inactivates the lock-out function whenever the integrated circuit device is performing a specific operation requiring a voltage lower than the predetermined detection voltage, i.e., an operation associated with a low-voltage operating mode of the integrated circuit device. Accordingly, it is possible to selectively carry out the lock-out function in accordance with an operating mode of the integrated circuit device. One example of an operation associated with the low-power operating mode is a test operation used to detect the transfer of a voltage between external power supply voltage EVC and internal power supply voltage IVC.

Lock-out unit 110 comprises a mode detector 120, a voltage divider 130, a comparator 140, and a signal combiner 190. Mode detector 120 combines at least two signals indicative of an operating mode of the integrated circuit device in order to determine whether the integrated circuit device is in the low-power operating mode. Mode detector 120 comprises a NOR gate 121 and an inverter 123. NOR gate 121 performs a NOR operation on an erase execution signal ERS_Execution input from an erase logic circuit 10 and a program execution signal PGM_Execution input from a program logic circuit 20.

Inverter 123 inverts a signal output by NOR gate 121. Where the integrated circuit device is executing an erase operation or a program operation, mode detector 120 outputs a signal with a logic level "high". Otherwise, mode detector 120 outputs a signal with a logic level "low".

Voltage divider 130 divides external power supply voltage EVC by a predetermined amount and transfers a resulting portion of external power supply voltage EVC to comparator 140. External power supply voltage EVC typically comprises a voltage supplied to the integrated circuit device from an outside source. Alternatively, an internal operating voltage VCC may be substituted for external power supply voltage EVC.

Referring to FIG. 3, voltage divider 130 comprises a switching transistor 131 having a gate connected to an output signal of mode detector 120. A first resistor 133 is connected between a drain of switching transistor 131 and a second resistor 135. Switching transistor 131 typically comprises a negative metal-oxide semiconductor (NMOS) transistor that is turned on and off by the output signal of mode detector 120.

First and second resistors 133 and 135 divide external power supply voltage EVC by a predetermined amount. The division of external power supply voltage by first and second resistors 133 and 135 is regulated by switching transistor 131. In other words, whenever the output of mode detector 120 has logic level "high", and hence, switching transistor 131 is turned on, first and second resistors 133 and 135 divide external power supply voltage EVC by the predetermined amount. The amount (i.e., the ratio) by which external power supply voltage EVC is divided is determined by a ratio of the respective resistances of first and second resistors 133 and 135. A divided voltage Vdvd resulting from the division of external power supply voltage EVC is applied to comparator 140.

Comparator 140 determines whether external power supply voltage EVC is lower than a predetermined detection voltage. Comparator 140 comprises an inverter 141 inverting the signal output by mode detector 120 and a differential amplifier 145 comparing a predetermined reference voltage Vref with divided voltage Vdvd. Preferably, reference voltage Vref is generated by a reference voltage generator 40 embedded in the integrated circuit device.

Differential amplifier 145 is turned on and off in response to the signal output by mode detector 120 and applied thereto through inverter 141. Where divided voltage Vdvd is higher than reference voltage Vref, an output signal of differential amplifier 145 has a logic level "low". Otherwise, where divided voltage Vdvd is lower than the reference voltage Vref, the output signal of differential amplifier 145 has a logic level "high".

The output of differential amplifier 145 is received by signal combiner 190. In addition, signal combiner 190 also receives a signal output by lock-out controller 150 and the signal output by mode detector 120.

Signal combiner 190 comprises a NAND gate 191 receiving the signals output by differential amplifier 145, lock-out controller 150, and mode detector 120. Signal combiner 190 further comprises an inverter receiving and inverting an output of NAND gate 191 in order to produce a lock-out control signal VLKO. The logic level of lock-out control signal VLKO depends on the respective logic levels of the signals output by differential amplifier 145, lock-out controller 150, and mode detector 120.

Where divided voltage Vdvd is higher than reference voltage Vref, signal combiner 190 generates lock-out control signal VLKO with logic level "low". Otherwise, where divided voltage Vdvd is lower than reference voltage Vref and where the integrated circuit is executing an erase or program operation, as indicated by erase execution signal ERS_Execution or program execution signal PGM_Execution, signal combiner 190 generates lock-out control signal VLKO with logic level "high". Otherwise, signal combiner 190 generates lock-out control signal VLKO with logic level "low".

Where lock-out control signal VLKO is generated with logic level "high", the integrated circuit device terminates an operation being executed thereon (e.g., a program or erase operation).

Where the integrated circuit device is in a low-voltage operating mode, lock-out controller 150 outputs a signal with a logic level "low", causing signal combiner 190 to output lock-out control signal VLKO with logic level "low". This causes signal combiner 190 to output lock-out control signal VLKO with a logic level "low" even in cases where divided voltage Vdvd is lower than reference voltage Vref. In other words, the lock-out function is disabled even where external power supply voltage EVC becomes lower than a detection voltage Vdetect.

Lock-out controller 150 comprises a lock-out control logic/fuse circuit 160 and an inverter 170. Lock-out control logic/fuse circuit 160 receives mode information (or a control signal from a user) for the integrated circuit device. Lock-out control logic/fuse circuit 160 outputs a lock-out disable signal VLKO_DISABLE to signal combiner 190 to inactivate the lock-out function, by analyzing the mode information, when the integrated circuit device is operating in the low-voltage operating mode.

Lock-out disable signal VLKO_DISABLE generated by lock-out control logic/fuse circuit 160 is inverted by inverter 170 and input to signal combiner 190. Lock-out control logic/fuse circuit 160 typically comprises a logic circuit generating lock-out disable signal VLKO_DISABLE by analyzing the mode information about the integrated circuit device. Alternatively, lock-out control logic/fuse circuit 160 may comprise a fuse circuit (i.e., a "circuit breaker") switching on or off in response to control signals supplied by a user. Modifications to lock-out control logic/fuse circuit 160 may be variously implemented by those skilled in the art.

Figure 4:
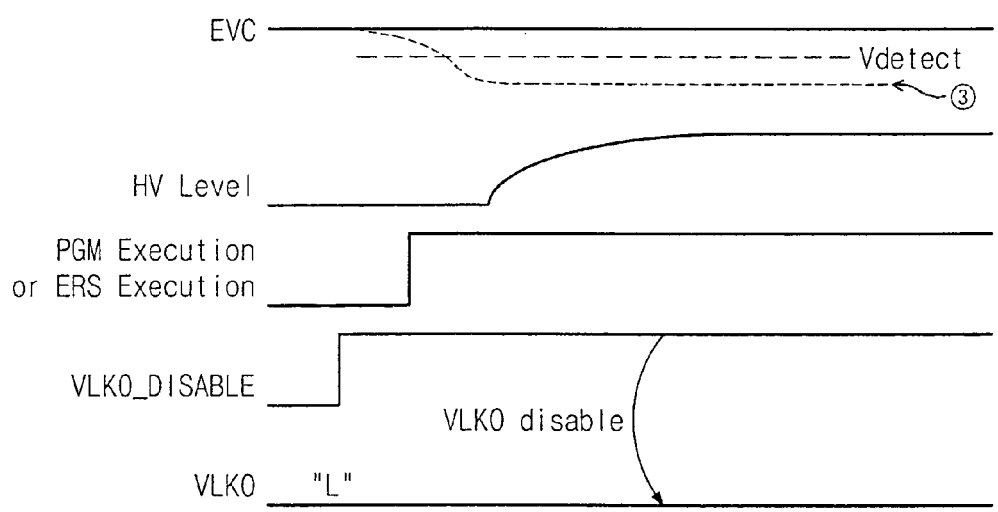
FIG. 4 is a waveform timing diagram illustrating the operation of the lock-out circuit shown FIGS. 2 and 3 under low power.

FIG. 4 is a timing diagram illustrating the operation of the lock-out circuit shown FIGS. 2 and 3. In particular, FIG. 4 illustrates a sequence of operations performed by the integrated circuit device when it is in the low-voltage operating mode.

Referring to FIG. 4, lock-out control signal VLKO is forced to remain at logic level "low" while lock-out disable signal VLKO_DISABLE is at logic level "high", even when external power supply voltage EVC falls below predetermined detection voltage Vdetect (i.e., even when divided voltage Vdvd is detected to be lower than reference voltage Vref).

Because setting lock-out disable signal VLKO_DISABLE to logic level "high" forces lock-out control signal VLKO to remain at logic level "low", the lock-out function is disabled in lock-out circuit 100 according to an operating mode of the integrated circuit device.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A lock-out circuit adapted for use in an integrated circuit device, the lock-out circuit comprising:
    a lock-out unit performing a lock-out function according to a level of a power supply voltage of the integrated circuit device and comprising;
        a mode detector sensing whether the integrated circuit device is in an active mode,
        a comparator detecting whether the power supply voltage is lower than a predetermined level while the integrated circuit device is in the active mode, and
        a signal combiner receiving an output of the mode detector and an output of the comparator and generating a lock-out control signal according to the logic levels of the respective outputs of the mode detector and the comparator; and,
    a lock-out controller adapted to selectively inactivate the lock-out function in response to a mode of the integrated circuit device.

2. The lock-out circuit of claim 1, wherein the lock-out controller disables the lock-out function whenever the integrated circuit device executes an operation requiring a voltage lower than a predetermined detection voltage.

3. The lock-out circuit of claim 1, wherein the lock-out function is enabled whenever the integrated circuit device executes an operation requiring a voltage at least as high as a predetermined detection voltage.

4. The lock-out circuit of claim 1, wherein the power supply voltage is an external power supply voltage (EVC) or an internal operating voltage (VCC).

5. The lock-out circuit of claim 1, wherein the lock-out controller outputs a lock-out disable signal to the signal combiner in response to the mode of the integrated circuit device.

6. The lock-out circuit of claim 5, wherein the lock-out controller comprises a logic circuit generating the lock-out disable signal in response to the mode of the integrated circuit.

7. The lock-out circuit of claim 5, wherein the lock-out controller comprises:
    a fuse circuit selectively switching on or off in response to control signals supplied by a user of the integrated circuit device.

8. The lock-out circuit of claim 5, wherein the signal combiner inactivates the lock-out control signal in response to the lock-out disable signal.

9. The lock-out circuit of claim 1, wherein the comparator comprises:
    a voltage divider; and,
    a comparator adapted to compare a divided voltage output by the voltage divider with a predetermined reference voltage.

10. The lock-out circuit of claim 9, wherein the comparator comprises:
    a differential amplifier.

11. The lock-out circuit of claim 1, wherein the integrated circuit device comprises a flash memory device.

12. The lock-out circuit of claim 11, wherein the flash memory device is a NAND flash memory device.

13. A method of performing a lock-out function in an integrated circuit device, the method comprising:
    detecting an operating mode of the integrated circuit device; and,
    selectively disabling a lock-out function of the integrated circuit device according to the operating mode of the integrated circuit device by determining whether the integrated circuit device is in an active mode, determining whether a power supply voltage of the integrated circuit device is lower than a predetermined detection voltage, determining whether the integrated circuit device is in a low-voltage operating mode, and upon determining that the integrated circuit device is in the low-voltage operating mode, disabling the lock-out function.

14. The method of claim 13, wherein the lock-out function is disabled whenever the integrated circuit executes an operating requiring a power supply voltage lower than a predetermined detection voltage.

15. The lock-out circuit of claim 13, wherein the lock-out function is enabled whenever the integrated circuit is in an active mode and a power supply voltage falls below a predetermined detection voltage.

16. The lock-out circuit of claim 15, wherein the power supply voltage is an external power supply voltage (EVC) or an operating voltage (VCC).

17. The lock-out circuit of claim 13, wherein the determining whether the power supply voltage is lower than the predetermined detection voltage comprises:
    dividing the power supply voltage by a predetermined amount; and,
    comparing a result of the division with a predetermined reference voltage.

18. The method of claim 13, wherein the integrated circuit device comprises a flash memory device.

19. A lock-out circuit generating a lock-out control signal disconnecting an operating voltage from an integrated circuit, the lock-out circuit comprising:
    a lock-out unit comprising a mode detector sensing whether the integrated circuit is in an active mode, a comparator detecting whether a power supply voltage is lower than a predetermined level while the integrated circuit is in the active mode, and a signal combiner generating the lock-out control signal in response to outputs from the mode detector and the comparator; and
    a lock-out controller inactivating the lock-out control signal in response to a mode of the integrated circuit.

* * * * *